(12) United States Patent
Mesgarani et al.

(10) Patent No.: US 12,013,713 B2
(45) Date of Patent: Jun. 18, 2024

(54) MICRO ANALOG SENSOR CIRCUIT AND SYSTEM

(71) Applicant: Apple Inc., Cupertino, CA (US)

(72) Inventors: Ali Mesgarani, Sunnyvale, CA (US); Ke Yun, San Jose, CA (US); Seyedeh Sedigheh Hashemi, Santa Clara, CA (US); Jasdeep S. Dhaliwal, Fremont, CA (US); Mansour Keramat, Los Gatos, CA (US); Jafar Savoj, Sunnyvale, CA (US); Bruno W. Garlepp, Sunnyvale, CA (US); Vahid Majidzadeh Bafar, Campbell, CA (US); Emerson S. Fang, Fremont, CA (US)

(73) Assignee: Apple Inc., Cupertino, CA (US)

( * ) Notice: Subject to any disclaimer, the term of this patent is extended or adjusted under 35 U.S.C. 154(b) by 488 days.

(21) Appl. No.: 17/033,528

(22) Filed: Sep. 25, 2020

(65) Prior Publication Data

US 2022/0100220 A1    Mar. 31, 2022

(51) Int. Cl.
| | |
|---|---|
| *G05F 3/26* | (2006.01) |
| *G01K 7/01* | (2006.01) |
| *H02M 3/07* | (2006.01) |
| *H03M 1/34* | (2006.01) |
| *H03M 3/00* | (2006.01) |

(52) U.S. Cl.
CPC ............ *G05F 3/262* (2013.01); *G01K 7/01* (2013.01); *H03M 1/34* (2013.01); *H03M 3/458* (2013.01); *G01K 2217/00* (2013.01); *H02M 3/07* (2013.01)

(58) Field of Classification Search
CPC ............ G05F 3/262; G01K 7/01; H03M 1/34; H03M 3/458
USPC ........................................................ 374/178
See application file for complete search history.

(56) References Cited

U.S. PATENT DOCUMENTS

| | | | |
|---|---|---|---|
| 9,158,320 B1 | 10/2015 | Shrivastava | |
| 9,857,814 B2 * | 1/2018 | Cohen | ...... G01K 7/00 |
| 10,591,362 B2 | 3/2020 | Cho et al. | |
| 2009/0261998 A1 * | 10/2009 | Chae | ...... H03M 3/46 |
| | | | 341/158 |

(Continued)

FOREIGN PATENT DOCUMENTS

WO    WO-0199283 A1 *  12/2001  .............. H03M 1/14

*Primary Examiner* — Lisa M Caputo
*Assistant Examiner* — Cynthia L Davis
(74) *Attorney, Agent, or Firm* — Kowert, Hood, Munyon, Rankin & Goetzel, P.C.; Dean M. Munyon

(57) ABSTRACT

The present disclosure is directed to a system implementing a sensor. A sensing system is implemented in a functional circuit block that is coupled to a global supply voltage node. The sensing system includes a power converter circuit configured to generate a regulated voltage level on a local supply node using the voltage present on the global supply voltage node. The system also includes a sensor circuit coupled to receive the regulated voltage node, wherein the sensor is configured to compare corresponding parameters of different ones of a number of subset of device at a plurality of different time points and generate a plurality of comparison results. The comparisons generate an analog signal that is proportional to the operating parameter. An analog-to-digital converter (ADC) is coupled to receive the analog signal and generate a plurality of bits corresponding thereto.

20 Claims, 10 Drawing Sheets

(56) References Cited

U.S. PATENT DOCUMENTS

| | | | |
|---|---|---|---|
| 2011/0084681 A1* | 4/2011 | Herbst | G05F 3/30 |
| | | | 323/313 |
| 2017/0336265 A1* | 11/2017 | Sato | H05K 1/0201 |
| 2018/0149526 A1* | 5/2018 | Abughazaleh | G01K 7/16 |
| 2021/0063246 A1* | 3/2021 | Jones, III | G01K 7/01 |

* cited by examiner

MICRO ANALOG SENSOR CIRCUIT AND SYSTEM

BACKGROUND

Technical Field

This disclosure is directed to electronic circuits, and more particularly, parameter sensing in electronic circuits.

Description of the Related Art

As features sizes have decreased, the number of transistors on integrated circuits (ICs) has correspondingly increased. The increased number of transistors per unit area has resulted in a corresponding increase in thermal output of ICs. Furthermore, the increased number of transistors per unit area has also corresponded to a decrease in the supply voltages provided to various functional circuitry on an IC. This has in turn led to significant challenges in balancing performance, power consumption, and thermal output of ICs. To this end, many ICs implement subsystems that monitor various metrics of the IC. Temperature is one metric that is commonly monitored for various reasons. Accordingly, an IC may have temperature sensors implemented thereon (e.g., within certain functional circuit blocks). Such temperature sensors may provide temperature readings to other circuits that carry out various control functions, such as adjusting voltages, clock frequencies, and/or workloads of various functional circuit blocks based on their respectively reported temperatures.

SUMMARY

The present disclosure is directed to a system implementing a sensor. In one embodiment, a sensing system is implemented in a functional circuit block that is coupled to a global supply voltage node. The sensing system includes a power converter circuit configured to generate a regulated voltage level on a local supply node using the voltage present on the global supply voltage node. The system also includes a sensor circuit coupled to receive the regulated voltage node, wherein the sensor is configured to compare corresponding parameters of different ones of a number of subsets of device at a plurality of different time points and generate a plurality of comparison results. The comparisons generate an analog signal that is proportional to the operating parameter. An analog-to-digital converter (ADC) is coupled to receive the analog signal and generate a plurality of bits corresponding thereto.

In one embodiment, the parameter is a temperature, and the sensor is a temperature sensor utilizing bipolar transistors. The temperature sensor includes a plurality of bipolar transistors and a switching circuit. Using dynamic element matching, the switching circuit is configured to select, for a first sample, a first subset of the bipolar transistors to be coupled to a first circuit branch and a second subset of the bipolar transistors to be coupled to a second circuit branch. The sensor is configured to generate an indication of a temperature based on a difference between the base-emitter voltages of the first subset and the base-emitter voltages of the second subset. For a sample subsequent to the current sample, the switching circuit is configured to select different ones of the plurality of bipolar transistors to be part of the first and second subsets.

BRIEF DESCRIPTION OF THE DRAWINGS

The following detailed description makes reference to the accompanying drawings, which are now briefly described.

DETAILED DESCRIPTION OF EMBODIMENTS

Figure 1:
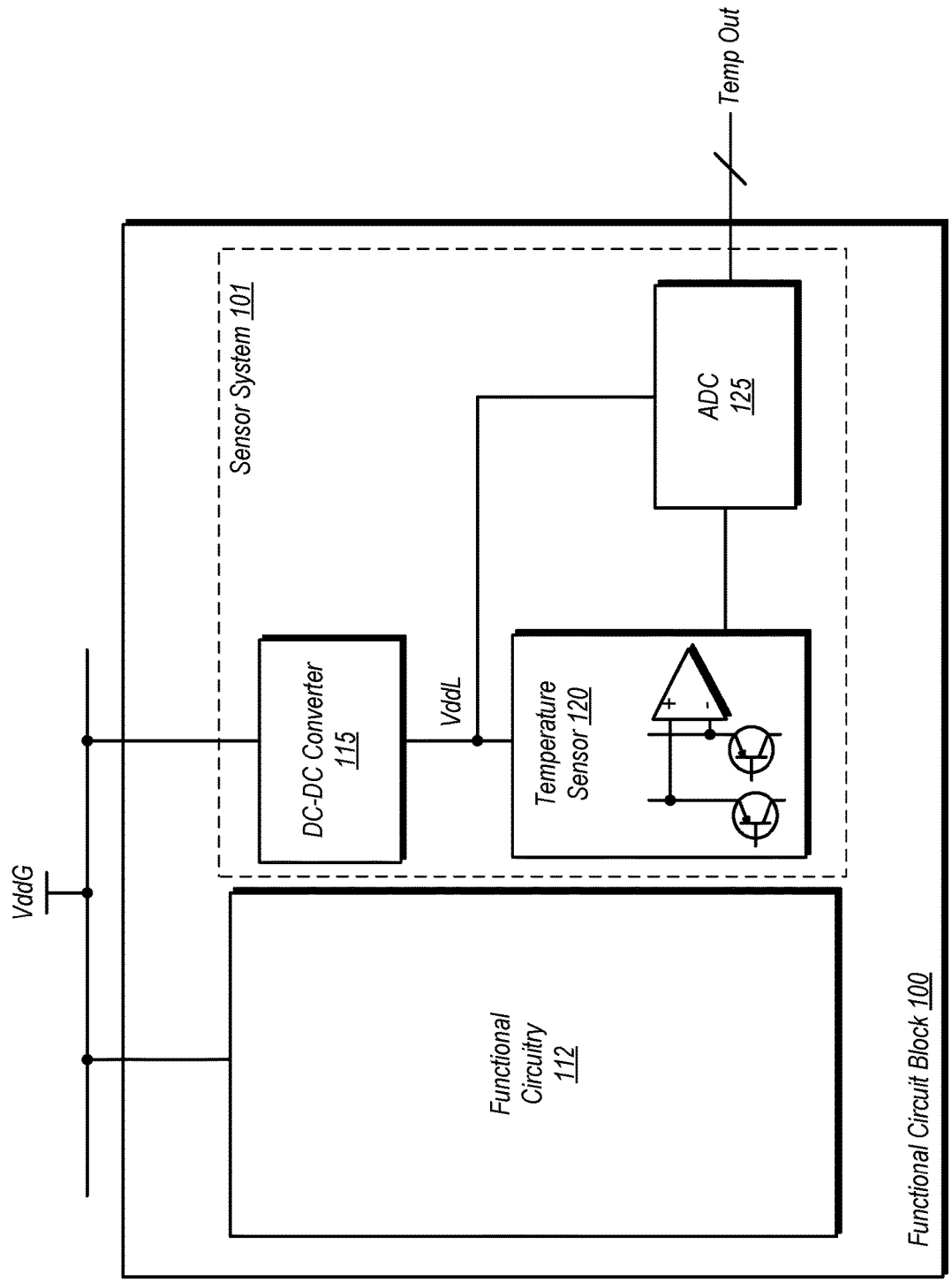
FIG. 1 is a block diagram of one embodiment of a sensing system.

The present disclosure is directed to a temperature sensing system usable in integrated circuits. As features sizes of devices on integrated circuits have become smaller, the density of circuitry has correspondingly increased. Increased density of circuitry can result in higher density power consumption, and thus, faster temperature rises in "hot spots" occurring during operation of an integrated circuit. Furthermore, these hot spots may be more localized due to the increased circuit density. Thus, implementing sensing circuitry (e.g., temperature sensors) within these high density circuits has become more challenging.

Nevertheless, the implementation of high-precision, compact temperature sensors (among other types) has become increasingly important in integrated circuits, such as central processing units (CPUs), graphics processing units (GPUs), and so on. Temperature sensing and monitoring may be performed to detect rising temperatures and thus allow corrective actions to be taken to prevent overheating, functional failures, and even physical failure of the circuits. However, due to the density of the circuits and the localization of hot spots, the compactness of temperature sensing circuitry is becoming more important, as it is desirable to place such circuitry as close as possible to (if not within) the circuitry that produces hot spots. Additionally, due to the density of modern integrated circuits, large temperature gradients may exist on a single chip, and thus more instances of a temperature sensing circuit may be implemented.

The need for a greater number of compact sensors can create a significant number of design challenges. For example, the analog circuits used to implement temperature sensors often require different power supplies than the digital circuitry implemented in various types of integrated circuits. This can create complications routing connections for analog power supplies into areas with a high density of digital circuits. Another challenge is the implementation of the actual temperature sensors themselves. Temperature sensors based on bipolar transistors can be implemented to provide accurate temperature readings, while the bipolar transistors thereof may be robust with regards to various types of stresses that may be placed thereon. However, sensors based on bipolar transistors typically require a large number of devices in parallel to provide accuracy due to mismatches between the individual devices, and thus can consume a significant amount of circuit area. Thus, temperature sensing in integrated circuits often times results in a tradeoff between accuracy of the sensor readings and area consumption, both of which can be critical to a successful design.

The present disclosure is directed to temperature sensors that may be compact in design while providing a desired level of accuracy, thereby at least partially obviating the tradeoff discussed above. Each temperature sensor may be implemented as part of a compact temperature sensing system. Each instance of the compact temperature sensing system may include a power converter coupled to receive a supply voltage that is provided to the functional circuitry of the functional circuit block in which it is implemented. In various embodiments, the power converter may be a compact boost converter generating a regulated supply voltage suitable for use in an analog temperature sensor. The analog temperature sensor may be implemented using bipolar transistors to determine a temperature using a difference in respective base-emitter voltages (sometimes referred to as a $\Delta V_{BE}$ sensor). However, instead of using a larger number of bipolar transistors, the temperature sensor implemented herein may utilize a relatively small number of devices. Mismatches inherent in different instances of the bipolar transistors may be addressed using a technique known as dynamic element matching, thereby allowing more accurate temperature readings with a smaller number of devices. Each implementation of a temperature sensing system may also include a relatively compact analog-to-digital converter (ADC) to convert analog signals from temperature readings into digital signals that can be conveyed to other circuitry for further processing, which may include the performance of various temperature control actions. Various embodiments of a compact temperature sensing system and the circuits implemented therein are now discussed in further detail.

FIG. 1 is a block diagram of one embodiment of a functional circuit block that may be implemented with corresponding temperature sensing circuitry in an integrated circuit. It is noted that the various elements of the drawing are not intended to illustrate any information with regard to the physical scale of the various units depicted therein. Rather, FIG. 1 is provided to illustrate an example arrangement of the various elements and their relationships to one another.

In the embodiment shown, functional circuit block 100 includes functional circuitry 112 that may carry out one or more of the intended functions of an integrated circuit. Functional circuitry 112 may be any type of digital, analog, or mixed signal circuitry. For example, functional circuitry 112 may, in one embodiment of an arithmetic unit in a processor circuit. In another embodiment, functional circuitry may be a transmitter system for transmitting wireless signals at various power levels.

A sensor system 101 is also implemented in functional circuit block 100. In practice, such a sensor system may be implemented within close proximity to the functional circuitry 112, if not actually within the functional circuitry itself. Sensor system 101 as shown here includes a power converter, DC-DC converter 115, a temperature sensor 120, and an ADC 125. ADC 125 may output digital signals indicative of a temperature that is sensed by temperature sensor 120. This information may be used by, e.g., a power management unit (not shown) to perform various temperature control actions, such as workload rebalancing, performance state reduction (e.g., reducing a clock frequency), or shutting down of the functional circuitry to prevent malfunctions and/or heat damage thereto.

In the embodiment shown, functional circuitry 112 and DC-DC converter 115 are both coupled to receive a supply voltage, VddG, from an external source. It is noted that in some embodiments, functional circuitry 112 and DC-DC converter 115 may operate off of different power supplies. In the example shown here, the supply voltage may be a regulated supply voltage, and may be that upon which functional circuitry 112 operates. DC-DC converter 120 in the embodiment shown is implemented as a boost converter, receiving the supply voltage VddG and outputting, at a higher voltage level, a regulated local supply voltage, VddL. The regulated local supply voltage VddL is provide to both temperature sensor 120 and ADC 125 in the embodiment shown, and is suitable for use with analog circuitry implemented therein.

Temperature sensor 120 in the embodiment shown is a $\Delta V_{BE}$-type temperature sensor. More particularly, temperature sensor 120 may generate an indication of a temperature based on a difference between the base-emitter voltages of at least two different bipolar transistors having different current densities. This difference is provided to an amplifier as depicted in the drawing, with an analog signal generated based on this difference. As the difference corresponds to a temperature of a sensed temperature, characteristics of the analog signal may also correspond to the same. The implementation here, as will be discussed below, may utilize a significantly lower number of bipolar transistors than a typical sensor of this type, enabling its implementation in much smaller area.

ADC 125 in the embodiment shown is coupled to receive one or more analog signals from temperature sensor 120, the analog signals corresponding to sensed temperatures. These analog signals may be converted into a digital format shown here as 'Temp Out'. The digital representation of the sensed temperature may be forwarded to various other circuits that may utilize the temperature information in various ways, such as to perform temperature control actions intended to reduce the temperature of the functional circuitry to prevent malfunction or damage. It is noted that the 'Temp Out' signal may, in some embodiments, represent an uncorrected temperature, with further processing performed to arrive at the actual temperature values. For example, digital processing may be performed on the 'Temp Out' signal to correct for gain, offset, and/or non-linearity, among other examples. In some embodiments, the value may be applied to a polynomial that corrects for one or more of these (or other) factors.

It is noted that while ADC 125 in the drawing shown is coupled to receive the regulated supply voltage VddL from DC-DC converter 115, embodiments are possible and contemplated in which ADC 125 is powered separately from temperature sensor 120, and may thus receive the global supply voltage.

Figure 2:
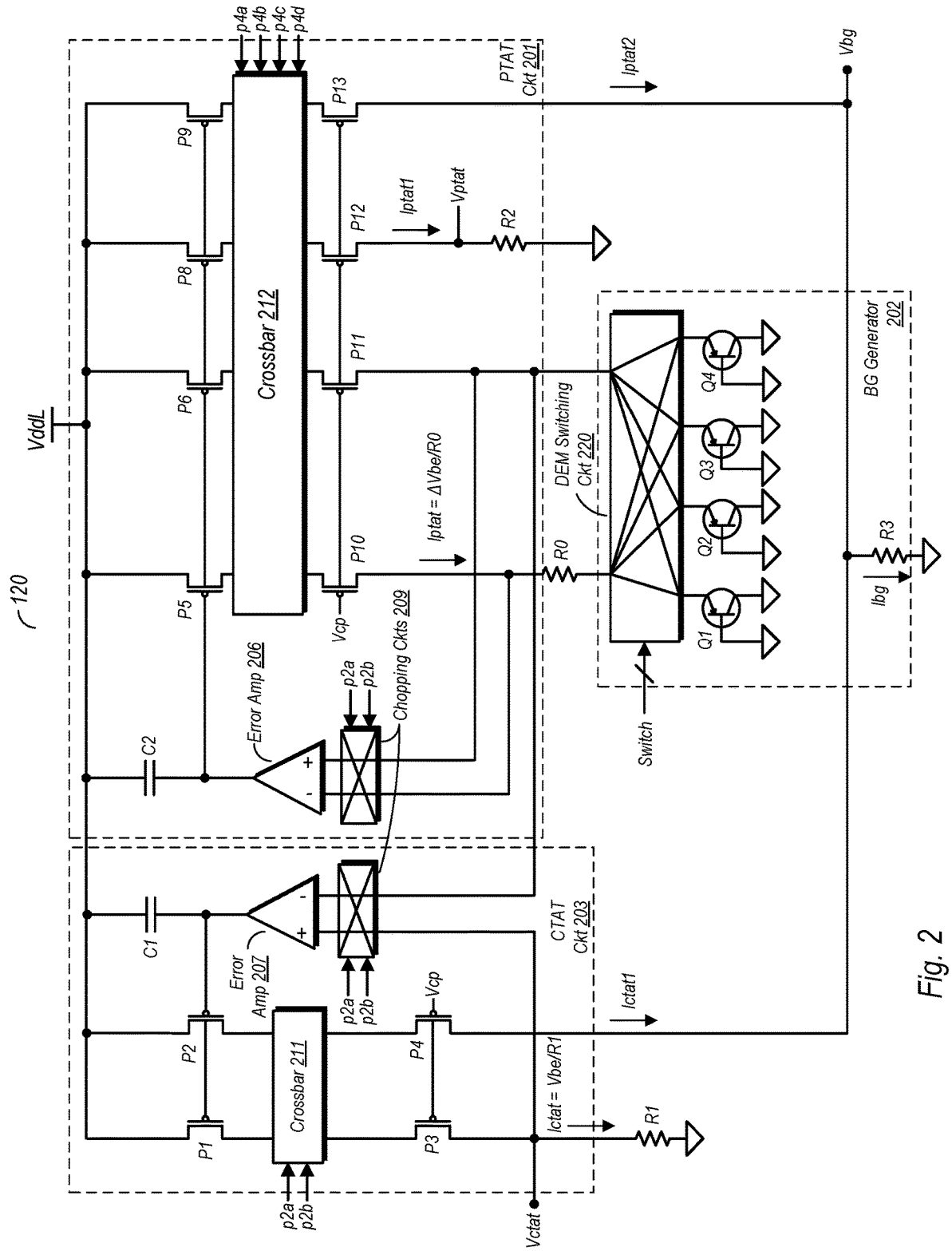
FIG. 2 is a schematic diagram of one embodiment of a temperature sensor circuit implemented in a sensing system.

FIG. 2 is a schematic diagram of one embodiment of a temperature sensor circuit implemented in a sensing system. In the embodiment shown, temperature sensor 120 is a $\Delta V_{BE}$-type temperature sensor, and includes a number of bipolar transistors (Q1-Q4 in this particular example). The circuitry of temperature sensor 120 may be subdivided into a PTAT (proportional to absolute temperature) circuit 201, a CTAT (complementary to absolute temperature) circuit 203, and a bandgap generator 202. These circuits are coupled to one another in a manner to generate analog signals based on the difference between selected ones of the bipolar transistors Q1-Q4. Although not explicitly shown here (for the sake of simplicity), temperature sensor 120 may also include an amplifier circuit, similar to that depicted in FIG. 1, to amplify $\Delta V_{BE}$ between the various circuit branches to generate analog indications of temperature that can be converted into a digital format. Temperatures in temperature sensor 120 may be measured over a number of temperature cycles. As will be discussed below, the couplings between different devices in the embodiment of FIG. 2 may be changed on a cycle-by-cycle basis.

In the embodiment shown, temperature sensor 120 may use the same set of bipolar transistors to generate both PTAT and bandgap voltages. Furthermore, utilizing techniques such as dynamic element matching (DEM) and chopping, a significantly lower number of bipolar transistors may be used, thereby enabling a highly compact sensor. Furthermore, the techniques used herein may also reduce noise. The techniques used in implementing temperature sensor 120, thereby enabling its relatively small size include the following:
1) Sharing bipolar devices for high sensitivity PTAT, CTAT and bandgap branches;
2) Amplifying the PTAT voltage by resistor ratios;
3) Chopping inputs to the error amplifiers (to reduce or eliminate offsets);
4) Dynamic element matching in current mirrors;
5) Dynamic element matching in bipolar transistors (to average out the effects of mismatches).

PTAT circuit in the embodiment shown includes a number of circuit branches that implement current mirrors. A crossbar switch 212 may be used to cross-couple various devices to one another during operation. These cross-couplings may be changed on a cycle-by-cycle basis. First and second circuit branches in the embodiment shown include PMOS devices P10 and P11, which are each coupled to provide a portion of the current to the bipolar transistors used in temperature measurements. PMOS transistor P12 and P13, are implemented in third and fourth circuit branches, respectively. Each of transistor P10-P13 includes a gate terminal coupled to receive a bias voltage Vcp, which may be generated by other voltage generation circuitry not shown here.

PMOS transistors P5, P6, P8, and P9 may be used to form current mirrors. Each of these devices includes a gate terminal that is coupled to the output of error amplifier 206. The particular circuit branch to which each of these devices is coupled to during any given cycle is dependent upon crossbar 212, and the signal provided thereto (p4a, p4b, p4c, and p4d). The states of these signals may change on a cycle-by-cycle basis, and thus the couplings between the transistors of the various circuit branches may correspondingly change. Crossbar 212 in the embodiment shown may enable the coupling of any of P5, P6, P8, and P9 to any of P10, P11, P12, and P13.

A drain terminal of transistor P10 in the embodiment shown is coupled to resistor R0, which in turn is coupled to another crossbar switch, labeled here as DEM switching circuit 220. A PTAT current, Iptat, flow through this circuit branch. Meanwhile, the drain terminal of P11 is coupled directly to an input of DEM switching circuit 220. The drain terminal of P12 is coupled to an output node upon with a PTAT voltage, Vptat, may be taken, and is further coupled to resistor R2, whose other terminal is coupled to ground. A drain terminal of P13 is coupled to a bandgap voltage node Vbg.

Drain terminals of P10 and P11 are used to provide inputs to error amplifier 206. In this embodiment, signals from these nodes are fed to the error amplifier 206 via a chopping circuit 209, which is used to minimize or eliminate any unwanted offset voltages on these nodes, which may be implemented using various ones of a number of well-known chopping circuits. The configuration of chopping circuit 209 on any given cycle in the embodiment shown is dependent on signal p2a and p2b. As noted above, the output of error amplifier 206 is coupled to respective gate terminals of P5, P6, P8, and P9. Additionally, the output of error amplifier 206 is also coupled to a capacitor C2, which in turn is coupled to the local voltage node, VddL. Capacitor C2 may filter out AC noise and provides stability for the feedback loop.

Current mirrors are formed in PTAT circuit 201 by the loop that includes error amplifier 206. The particular transistors forming the current mirrors may change from one cycle to the next by the switching of crossbar 212. In particular, crossbar 212 implements dynamic element matching in the current mirrors by, on successive cycles, coupling different ones of P5, P6, P8 and P9 to ones of P10, P11, P12, and P13. Furthermore, different ones of the group of transistors crossbar 212 may be coupled to provide currents (such as Iptat) to the circuit legs below the crossbar 212. Switching the transistor couplings each cycle may thus minimize errors that could otherwise be induced by mismatches in the various transistors by averaging these errors out over time.

CTAT circuit 203 in the embodiment shown includes error amplifier 207, which includes another instance of a chopping circuit on its respective inputs. The chopping circuit is coupled to receive one input from PTAT circuit 201 (in particular, from the branch including transistor P11), and another input from the node upon which Vctat is taken. The output of error amplifier 207 is coupled to a capacitor C1 which provides AC coupling to the local voltage supply node. The output of error amplifier 207 is also coupled to respective gate terminals of PMOS transistors P1 and P2. A crossbar switch 211 is coupled to the drain terminals of P1 and P2, and is further coupled to source terminals of P3 and P4, the latter two having respective gate terminals coupled to receive the bias voltage Vcp. Crossbar switch 211 may implement additional dynamic element matching in the circuit by alternately coupling transistors P1 and P2 to the circuit branches of P3 and P4, depending on respective states of the input signals p2a and p2b. The arrangement of CTAT circuit 203 forms a current mirror in which the current Ictat is mirrored from the branch of P3 as Ictat in the branch of P4.

Bandgap circuit 202 in the embodiment shown includes another crossbar, DEM switching circuit 220, which may couple respective two of the circuit branches (those including P10 and P11) to respective collectors of bipolar transistors Q1-Q4. In one embodiment, for a given cycle, DEM switching circuit 220 may select a subset of bipolar transistors Q1-Q4 to be coupled the circuit branch including R0, while a second subset of bipolar transistors is coupled to the circuit branch of P11. The subset may vary in size, and may be as few as one transistor. For example, in a given cycle, with n bipolar transistors, n−1 bipolar transistors may be coupled to the circuit branch of R0, while one of the bipolar transistors may be coupled to the circuit branch of P11. In a next cycle, these subsets may be changed, with at least one bipolar transistor of a given subset being coupled to the opposite circuit branch from the previous cycle.

The switching may be controlled by the 'Switch' signals in the illustrated embodiment shown, and may be provided from a control circuit not shown in FIG. 2. The pattern in which bipolar transistors are selected to be coupled to respective ones of the first and second circuit branches may, in one embodiment, be carried out in a pre-determined manner. This may result in a predictable averaging out of the mismatch-induced error. In another embodiment, the switching may be randomized to cause a corresponding randomization of error that would otherwise occur due to device mismatches.

In the embodiment shown, the PTAT current, Iptat, is generated by the $\Delta V_{BE}$ across R0, with the $\Delta V_{BE}$ being the difference in the base-emitter voltages in the first and second subsets of bipolar transistors in a given measurement cycle. This current is mirrored, at Iptat1, to the circuit branch containing P12 and R2. The mirrored current Iptat1 is passed through resistor R2 and therefore generates the PTAT voltage, Vptat. More particularly, $$VPTAT = R2/R0 \times \Delta Vbe \quad \text{(Eq. 1)}.$$

Thus, the PTAT voltage is amplified by the ratio resistors R2 and R0, as shown in Eq. 1 above. Furthermore, since the PTAT voltage depends on the value of $\Delta V_{BE}$, it is thus indicative of a temperature of temperature sensor 120. Accordingly, this voltage may be provided to either an amplifier and then to an ADC, or directly to an ADC, for conversion to digital in order to relay the sensed temperature value to control circuitry implemented on the integrated circuit.

It is noted that the number of bipolar transistors shown here is intended to be illustrative rather than limiting. The exact number used may vary from one embodiment to another, although this number may nevertheless be smaller than the numbers used for typical implementations of a $\Delta V_{BE}$-type temperature sensor. In one embodiment, the number of bipolar transistors may be as few as three, with one of the bipolar transistors (or transistor groups) being larger than the other. More generally, the selection of bipolar may be made such that the current density in one leg of the circuit is different than the other. This may be accomplished by having the same current in bipolar transistors of different sizes, having the same size bipolar transistors with different bias currents, or any other suitable arrangement.

The PTAT current, Iptat, is also mirrored as Iptat2 through the circuit branch containing P13. In the CTAT circuit 203, a CTAT voltage, Vctat, is formed at the junction of transistor P3 and resistor R1, in the branch in which the CTAT current Ictat is generated. This current is mirrored as Ictat1 in the circuit branch of CTAT circuit 203 including transistor P4. This current is summed with Iptat2 to form a bandgap current, Ibg, which is passed through resistor R3 to generate a bandgap reference voltage Vbg.

Various embodiments of the circuit shown in FIG. 2 allow for high-sensitivity generation of PTAT, CTAT, and bandgap voltage, and may use as few as a single pair of bipolar transistors. The area may be minimized relative to previous $\Delta V_{BE}$-type temperature sensors. The area reduction and improved accuracy of the temperature sensor shown in FIG. 2 may be achieved using the various techniques such as chopping on the inputs to the error amplifiers and dynamic element matching in the current mirrors and bipolar transistors as shown in FIG. 2.

Assuming transistors P5 and P8 are equal in width and length, the PTAT current is derived from the following equation:

$$VPTAT = \frac{R2}{R0} \Delta Vbe = \quad \text{(Eq. 2)}$$

-continued
$$\frac{R2}{Ro}\frac{kT}{q}\left[\ln\left(\frac{ID1}{IS1}\right) - \ln\left(\frac{ID2}{IS2}\right)\right] = \frac{R2}{Ro}\frac{kT}{q}\ln\left(\frac{ID1}{ID2} \times \frac{IS2}{IS1}\right),$$

where $I_{D1}$, $I_{D2}$, $I_{S1}$ and $I_{S2}$ are emitter and saturation currents of two bipolar transistors respectively (or two subsets in embodiments utilizing more than two bipolar transistors), k is Boltzman's constant, T is the temperature, and q is the electrical charge. This equation may be adjusted accordingly if P5 and P8 are not equal in width and length. Since dynamic element matching removes offset between hi and ha (through the use of DEM switching circuit 220), the above equation reduces to:

$$VPTAT = \frac{R2}{R0}\frac{kT}{q}\ln\left(\frac{IS2}{IS1}\right), \text{ where} \quad \text{(Eq. 3)}$$

$$IS = eAn_i^2\left(\frac{1}{N_D}\sqrt{\frac{D_p}{\tau_p}} + \frac{1}{N_A}\sqrt{\frac{D_n}{\tau_n}}\right). \quad \text{(Eq. 4)}$$

In Equation 4, A is the cross-sectional area of the PN junction in the bipolar transistors, $D_P$ and $D_n$ are the diffusion coefficients of holes and electrons, respectively, ND and NA are donor and acceptor concentrations at n and p sides of the PN junction, respectively, $\tau_p$ is the carrier lifetime of holes, $\tau_n$ is the carrier lifetime of electrons, and $n_i$ is the intrinsic carrier concentration.

Since the dopings for two bipolar transistors are relatively close to one another, VPTAT simplifies to:

$$VPTAT = \frac{R2}{R0}\frac{kT}{q}\ln\left(\frac{IS2}{IS1}\right) = \frac{R2}{R0}\frac{kT}{q}\ln\left(\frac{A_2}{A_1}\right). \quad \text{(Eq. 5)}$$

Since bipolar transistors are typically realized in units of single bipolar devices, the current IPTAT can be expressed as:

$$IPTAT = \frac{R2}{R0}\frac{kT}{q}\ln\left(\frac{IS2}{IS1}\right) = \frac{R2}{R0}\frac{kT}{q}\ln(n) \quad \text{(Eq. 6)}$$

where n is the ratio of the number of bipolar devices in each branch (subset). It can be seen that after dynamic element matching most of the inaccuracy of the PTAT current is caused by the mismatch between the ratio of the bipolar transistors in the two branches. Conventionally large bipolar devices, and common centroid layout techniques may be used to improve the matching of the bipolars which results in large area overhead.

The bipolar transistors in one embodiment of the circuit shown shown in FIG. 2 may be broken down to n+1 unit elements. At any given time (e.g., in any given cycle), one of the bipolar transistors may be connected to the right branch (e.g., to P11) through DEM switching circuit 220 while the remaining n bipolar transistors are connected to the left branch (e.g., to R0). A pointer associated with DEM switching circuit 220 may keep track of the location of the bipolar transistors (relative to the branch to which they are connected) and will connect the next device to the right branch in the next clock cycle while connecting the remaining devices to the left branch. The ratio of the bipolars in each cycle can then be expressed as:

$$\frac{x_1}{\sum_1^n x_i}$$ (Eq. 6)

$$\frac{x_2}{\sum_1^n x_i}$$

$$\frac{x_n}{\sum_1^n x_i}.$$

Thus, after n clock cycles (and thus, n switching cycles), the ratio of the bipolar transistor will converge to n:

$$\frac{1}{n}\frac{\sum_1^n x_i}{\sum_1^n x_i} = \frac{1}{n}.$$ (Eq. 7)

Accordingly, the convergence to n may significantly remove the mismatch-induced errors.

Thus, temperature sensor 120 in various embodiments may be a high-precision, ultra-compact sensor suitable for use in integrated circuits including systems-on-a-chip (SoCs), central processing units (CPUs), graphics processing units (GPUs) and so on. The circuit may take advantage of sharing at least one pair of bipolar transistors to independently generate PTAT, CTAT, and bandgap voltages. Chopping techniques have also been implemented in various embodiments of sensor 120 to remove the offset of error amplifiers and relaxing flicker noise, enabling compact amplifier designs. Finally, through the various crossbars and DEM switching circuit 220, the dynamic element matching technique is used in the selection of bipolar transistors and transistors used in the current mirrors. This allows the use of a minimum number of bipolar transistors and compact current mirrors with that can negate error induced by device mismatches, thereby allowing a reduced size in the circuitry of the temperature sensor.

Figure 3:
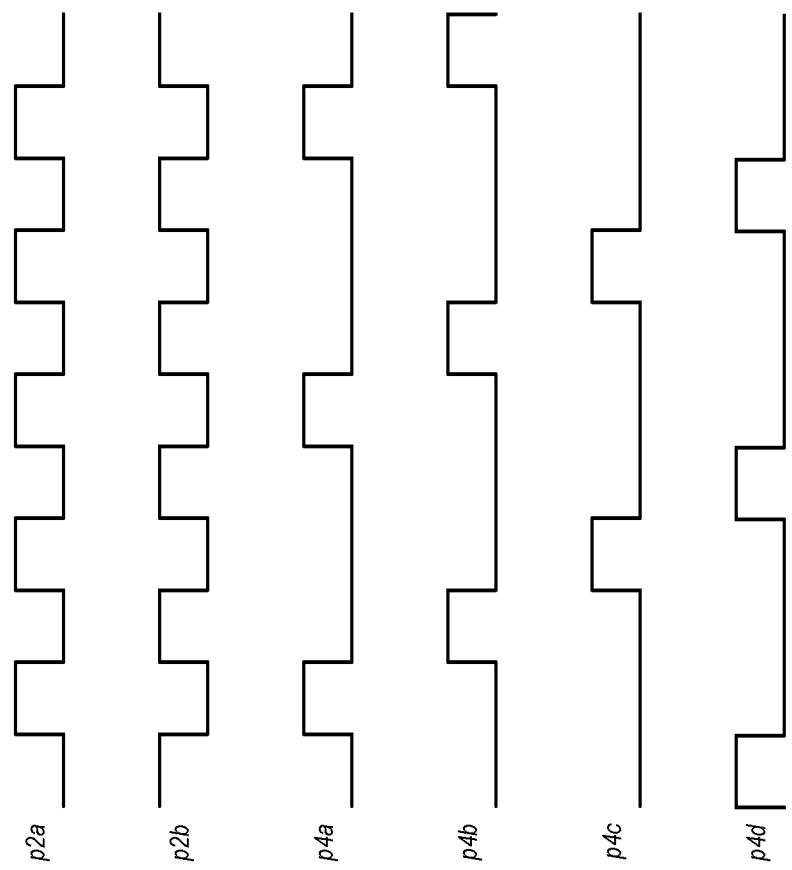
FIG. 3 is a timing diagram illustrating the timing of various switching circuits in the embodiment of the temperature sensor circuit of FIG. 2.

FIG. 3 is a timing diagram illustrating the timing of various switching circuits in the embodiment of the temperature sensor circuit of FIG. 2. In the embodiment shown, signals p2a and p2b are provided to crossbar 211 and both chopping circuits 209, and are complements of one another. Meanwhile, signals p4a-p4d are provided to crossbar switch 212 to switch the current mirrors from one cycle to the next. In some embodiments, p4a-p4d may be provided to DEM switching circuit 212, thereby connecting one bipolar transistor to the circuit branch of P11 in each cycle while the remaining bipolar transistors are connected to the circuit branch of R0. Generally speaking, the various connections of the current mirrors and the bipolar transistors of FIG. 2 may change on a cycle-by-cycle basis to obtain the benefit of reducing mismatch errors through dynamic element matching.

Figure 4:
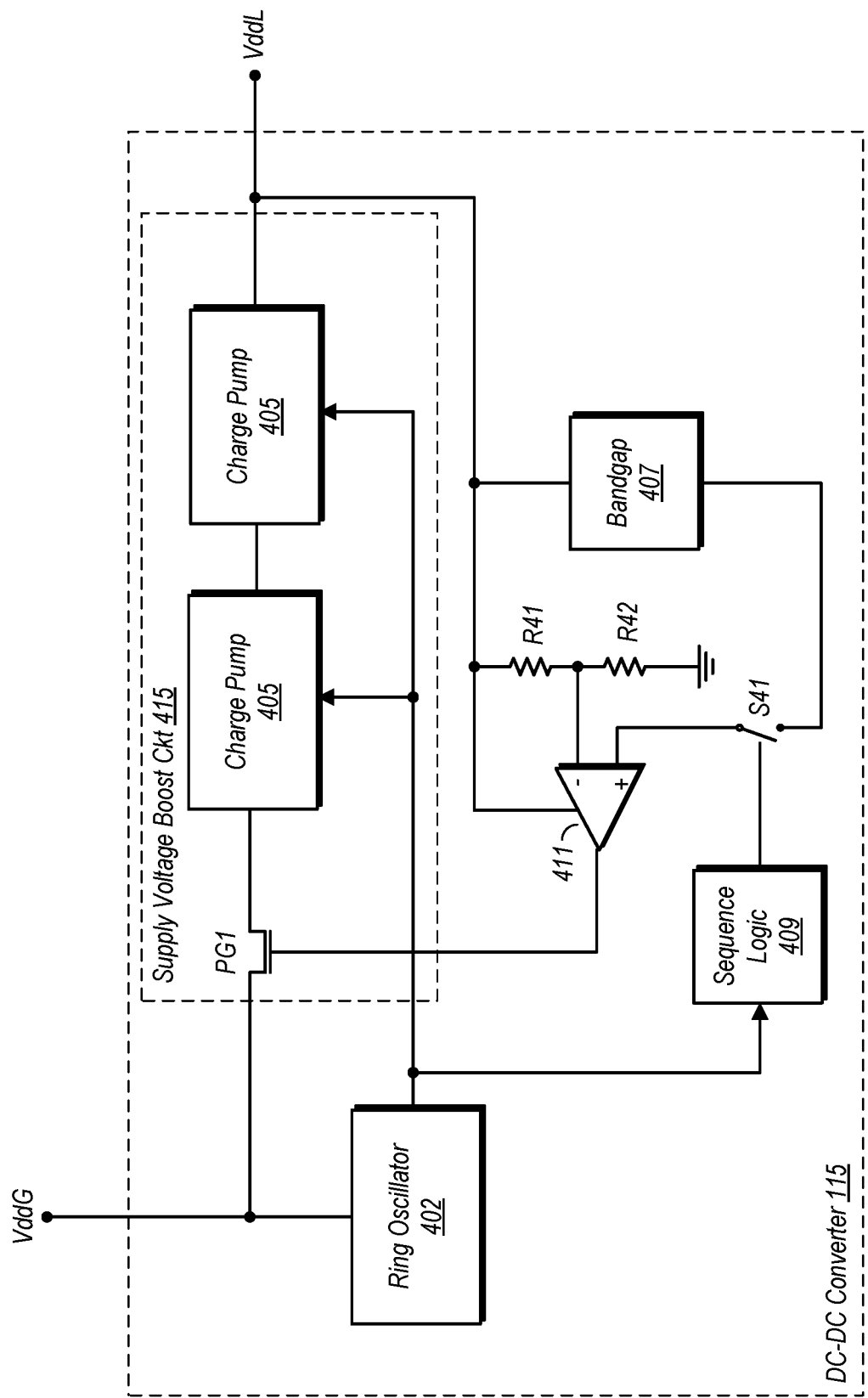
FIG. 4 is a diagram of one embodiment of a power converter used to generate a supply voltage for a temperature sensor circuit per the system of FIG. 1.

FIG. 4 is a diagram of one embodiment of a power converter used to generate a supply voltage for a temperature sensor circuit per the system of FIG. 1. Analog temperature sensors such as that discussed above often times have different power requirements than the digital circuitry implemented in the vicinity thereof. However, providing routing to convey a supply voltage for analog circuits in the power sensor may create complications in the design and layout of an integrated circuit. In various embodiments of the sensor system 101 of FIG. 1, a suitable supply voltage for the temperature sensor is generated locally therein, based on a global supply voltage.

For the purposes of this discussion, the term "global supply voltage" may be defined as the supply voltage that is provided to circuitry within the vicinity of the sensor system 101. While the term does not necessarily exclude a supply voltage provided more widely throughout the integrated circuit in which the sensor system is implemented, it is not limited in that manner, and may be one of several different supply voltages distributed to circuitry on a single integrated circuit die. The term "local supply voltage" may be defined herein as a supply voltage that is locally generated, e.g., within the sensor system, and distributed to a limited number of components, such as a temperature sensor as discussed above.

DC-DC converter 115 in the embodiment shown is a boost converter coupled to receive the global supply voltage, VddG, and generate a local supply voltage, VddL. Thus, the value of the local supply voltage in the embodiment is greater than the global supply voltage from which it is generated. This provides for correct operation of bipolar temperature sensors and bandgap references which cannot operate under low noisy supplies. The global supply voltage may be received to a pair of serially-coupled charge pumps 405, via a passgate transistor PG1 (when active), which together comprise supply voltage boost circuit 415. It is noted that embodiments utilizing, e.g., a single charge pump are also possible and contemplated, and thus the number used here is not intended to be limiting. The global supply voltage is also received by a ring oscillator 402, which produces a periodic output signal that is provided to charge pump 405 to synchronize the operation of switches therein. The periodic signal generated by ring oscillator 402 is also provided to sequence logic 409, which controls sequencing of the operation of DC-DC converter 115.

The output of the second charge pump in the embodiment shown is the local supply voltage, VddL, which may be provided to various circuits of the sensor system 101. The local supply voltage is also fed back to supply amplifier 411 and to a voltage divider comprising resistors R41 and R42. The junction between these two resistors is coupled to the inverting input of amplifier 411. The local supply voltage is also provided to a bandgap circuit 407, which is configured to generate a bandgap voltage. Bandgap circuit 407 may be any suitable type of circuitry configured for the generation of a bandgap voltage. A switch S41 is coupled between an output of the bandgap circuit 407 and the non-inverting input of amplifier 411.

During operation, the periodic signal generated by ring oscillator causes periodic closing of switch S41 and thus periodic sampling of the bandgap voltage generated by bandgap circuit 407. When switch S41 is closed, amplifier 411 generates an output signal based on the difference between the voltages on its two inputs, and thus controls the state of passgate PG1. When the voltage output from amplifier 411 is sufficient, PG1 is turned on and the global supply voltage is conveyed to the first charge pump 405. Generally speaking, DC-DC converter is arranged to cause activation of passgate PG1 to pass the global supply voltage VddG to the first charge pump when VddL falls to a sufficiently low level, and turn off the passgate when VddL is sufficiently high. Over time, the voltage on VddL is sufficiently smoothed out to a DC voltage that is provided at a level suitable for operating a temperature sensor such as that discussed above with reference to FIG. 2.

Figure 5:
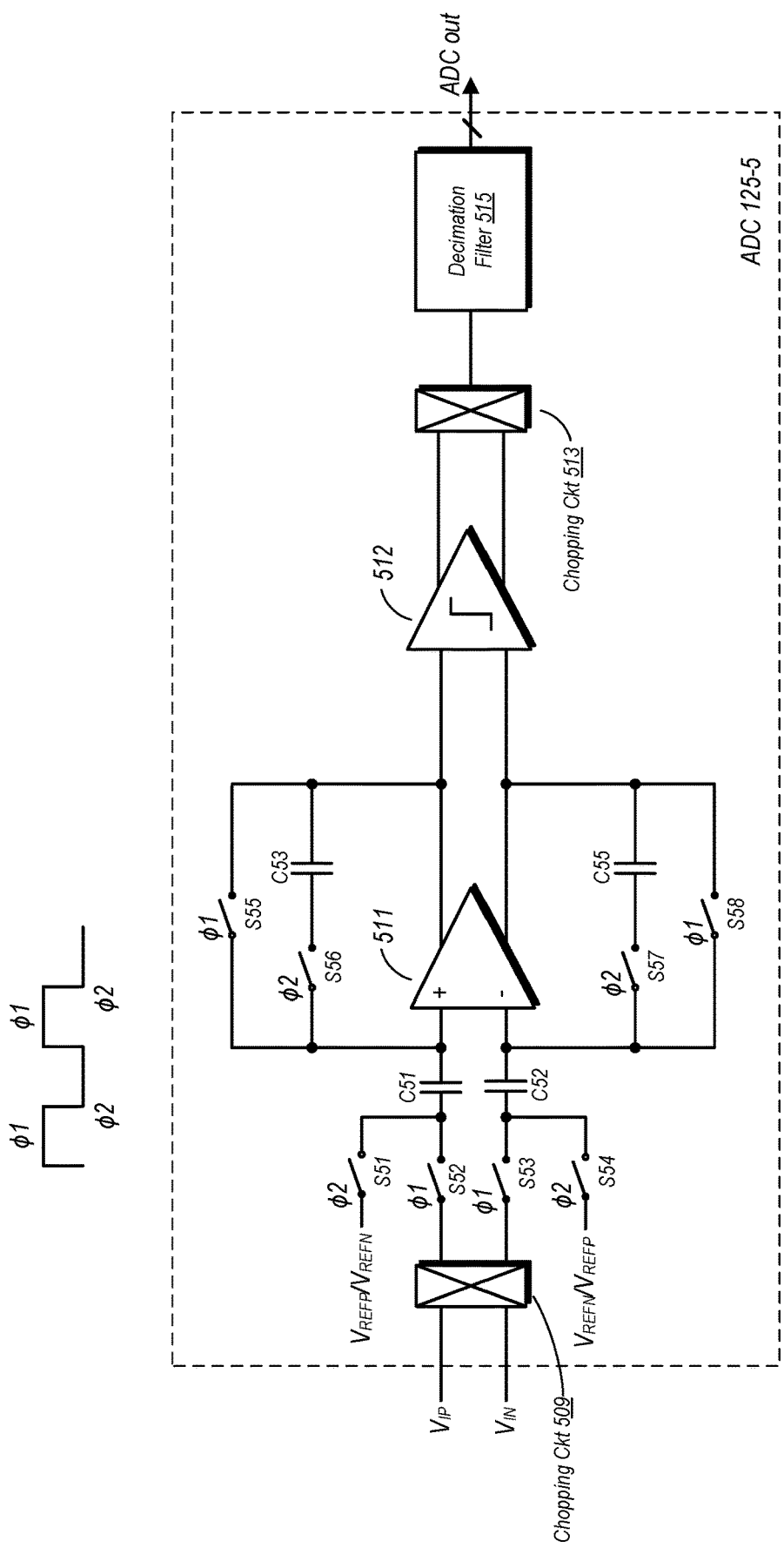
FIG. 5 is a schematic diagram of one embodiment of an analog-to-digital converter (ADC) used in one embodiment of a sensing system.

FIG. 5 is a schematic diagram of one embodiment of an analog-to-digital converter (ADC) used in one embodiment of a sensing system. In the embodiment shown, ADC 125-5 is a sigma-delta ADC that may be used in one embodiment of a sensor system 101. ADC 125-5 in the embodiment shown is coupled to receive inputs VIP and VIN at chopping circuit 509. In one embodiment, the VIP signal may be the VPTAT signal from a temperature sensor 120 as discussed above, while VIN is coupled to a ground node. The output of chopping circuit 509 is coupled to switches S52 and S53 which, when closed, coupled the chopping circuit 509 outputs to capacitors C51 and 652. The opposite terminal of C51 and C52 are coupled to non-inverting and inverting inputs, respectively, of amplifier 511. Amplifier 511 is configured to provide two outputs, which are coupled to the inputs of a comparator in the form of Schmitt trigger 512. The outputs of Schmitt trigger 512, are provided in either a logic low or logic state and are complementary to one another. Chopping circuit 513 is coupled to the outputs of Schmitt trigger 512, and after performing a chopping operation, provides one of these outputs as an input to decimation filter 515. Decimation filter 515 down-samples the signal received on its input and provides a digital output, ADC out. When coupled to receive analog signals from temperature sensor 120 as discussed above, the output of the of ADC 125-5 is a digital signal indicative of the sensed temperature value.

ADC 125-5 is also coupled to receive reference voltages $V_{REFP}$ and $V_{REFN}$, via switch S51 and S54. Switches S55 and S58 in the embodiment shown, when closed, effectively provide a short circuit between their respectively coupled output and input of amplifier 511. Switches S56 and S57 in the embodiment shown implement capacitive feedback paths between their correspondingly coupled inputs and output of amplifier 511, via capacitors C53 and C55, respectively.

As indicated in the drawing, certain switches close during a first phase, φ1 pf a clock cycle, while others closed during a second, opposite phase of the clock cycle, φ2. The clock signal may be provided by any suitable source (not shown here) and may have a frequency that oversamples the inputs of ADC 125-5.

Switches S52 and S53 in the embodiment shown capacitively coupled the inputs to ADC 125-5 during the first phase φ1, while switches S51 and S54 effectively reset the inputs during the second phase, φ2. During the first phase, the amplifier 511 outputs are coupled to corresponding inputs due to the closing of switches S55 and S58. During the second phase, the capacitive feedback paths are formed by the closing of switches S56 and S57, with this portion of the circuit effectively performing an integration operation whose output is dependent on the difference between the inputs. Comparator 512 performs the initial conversion to digital, with the values of the complementary output signals being dependent on whether the value of the difference between inputs has increased or decreased in the current cycle relative to the previous cycle. Digital filtering and decimation is performed on the selected output signal by decimation filter 515. In some embodiment, decimation filter 515 may include, or may be coupled to a storage mechanism, such as a register in which the final digital value for a temperature sensing cycle can be captured.

Figure 6:
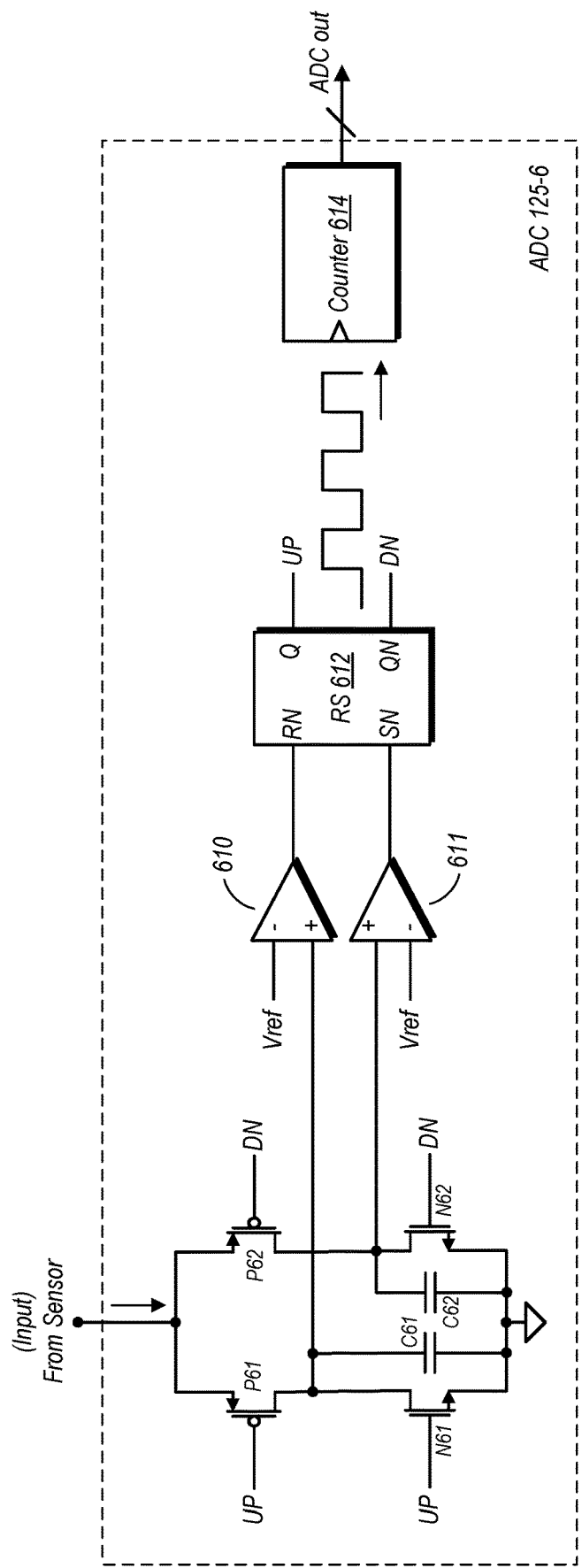
FIG. 6 is a schematic diagram of another embodiment of an ADC used in one embodiment of a sensing system.

FIG. 6 is a schematic diagram of another embodiment of an ADC used in one embodiment of a sensing system. In this particular embodiment, ADC 125-6 is a single slope ADC that may be used in one embodiment of a sensor system 101. The embodiment of ADC 125-6 shown includes PMOS transistor P61 and P62, the drain terminals of which are coupled to, respectively, the drain terminals of N61 and N62. A first capacitor C61 is coupled between ground and the drain terminal junction of P61 and N61, and further coupled to the non-inverting input of comparator 610. A second capacitor is coupled between ground and the respective drain nodes of P62 and N62, and further coupled to the non-inverting input of amplifier 611. The outputs of amplifiers 610 and 611 are respectively coupled to the RN and SN inputs of RS latch 612, which generates the UP and DN signals (output from the Q and QN outputs of RS latch 612). The UP signals are provided to the gate terminals of P61 and N61, while the DN signals are provided to the gate terminals of P62 and N62. The UP and DN signals are also input into a counter 614, which provides the final portion of the digital conversion, and thus provides a digital representation of the temperature as 'ADC out' in the embodiment shown.

Operation of the converter in the illustrated embodiment is as follows. During a sample from, e.g., IPTAT or VPTAT nodes temperature sensor 120 of FIG. 2, when the UP signal is low, P61 is on while N61 is off. Accordingly, capacitor C61 begins charging at a rate that is dependent upon the strength of the signal received on the input. At the same time, P62 is off, while N62 is on (since UP and DN are complementary to one another). Accordingly, C62 discharges at this time. As C61 charges, the voltage on the non-inverting input of comparator 611 increases. At the point the voltage provided to the non-inverting input exceeds the reference voltage, Vref (provided from voltage generation circuitry, omitted here, to the inverting input), comparator 611 outputs a logic high to the RN input of RS latch 612. Responsive thereto, the respective states of the output signals of changes, with UP transitioning to a logic high and DN transitioning to a logic low. When UP is a logic high, P61 is de-activated, while N61 is activated. With N61 activated, a discharge path is placed in parallel with C61, and thus the capacitor begins discharging.

The transitioning of UP to a logic high in the embodiment shown corresponds to a transitioning of DN to a logic low. When DN is low, P62 is activated while N62 is deactivated. Upon the activation of P62, capacitor C62 begins charging at a rate corresponding to the strength of the input signal. When, due to the charging of C62, the voltage on the non-inverting input exceeds the reference voltage, Vref, comparator 612 transitions high, thereby causing another switching of the states of the UP and DN signals. Accordingly, the respective states of transistors P61, P62, N61, and N62 change again, which C62 beginning a discharge cycle and C61 beginning a charging cycle.

Given that the rate of charging of capacitors C61 and C62 (which have substantially the same capacitance value) is dependent upon the strength of the input signal, the changing of the states of the UP and DN signals is also dependent on this by virtue of its dependence on the charging rate of the capacitors. Accordingly, the frequency of the signals output from RS latch 612 correspond to the strength of the analog signal received on the input, and thus (when coupled to a temperature sensor), the sensed temperature value. The switching of the states of the UP and DN signals by the counter is recorded for a given sample, with the final count being indicative of the temperature sensed by the temperature sensor. The final count may be provided to other circuitry (an example of which is discussed below) that makes use of the temperature information.

As with the embodiment of FIG. 5, ADC 125-6 may be implemented in a relatively compact form for use with sensor system 101 of FIG. 1.

Figure 7:
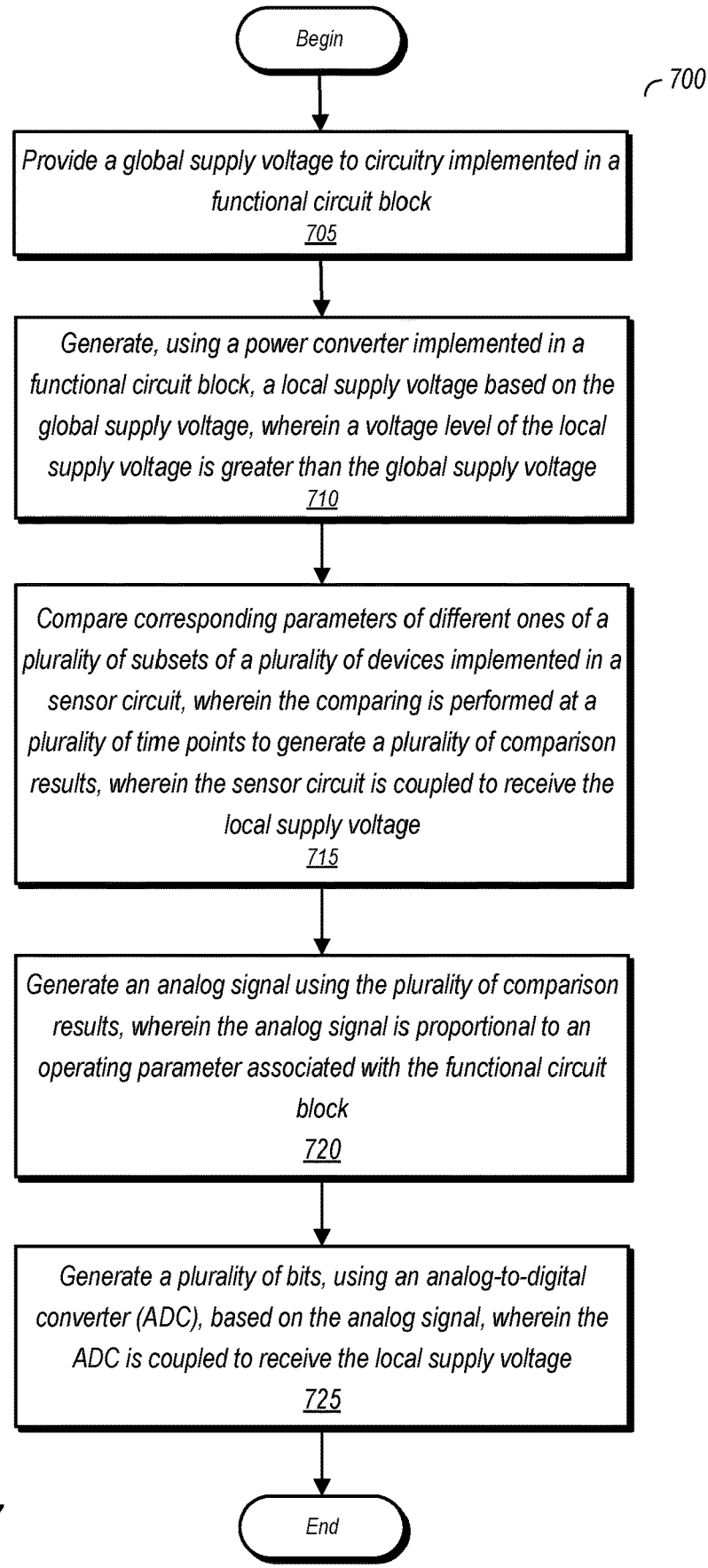
FIG. 7 is a flow diagram illustrating a method for operating one embodiment of a sensing system.

FIG. 7 is a flow diagram illustrating a method for operating one embodiment of a sensing system. Method 700 in the embodiment shown may be carried out by various embodiments of a sensing system 101 such as that illustrated in FIG. 1. Other embodiments of a sensing system not explicitly disclosed herein, but otherwise capable of carrying out Method 700, may be considered to fall within the scope of this disclosure.

Method 700 includes providing a global supply voltage to circuitry implemented in a functional circuit block (block 705). The method further includes generating, using a power converter implemented in a functional circuit block, a local supply voltage based on the global supply voltage, wherein a voltage level of the local supply voltage is greater than the global supply voltage (block 710). This may include generating the local supply voltage using at least one charge pump coupled to receive the global supply voltage. Using a sensor circuit, the method includes comparing corresponding parameters of different ones of a plurality of subsets of a plurality of devices implemented in the sensor circuit, wherein the comparing is performed at a plurality of time points to generate a plurality of comparison results, wherein the sensor circuit is coupled to receive the local supply voltage (b lock 715). Thereafter, the method includes generating an analog signal using the plurality of comparison results, wherein the analog signal is proportional to an operating parameter associated with the functional circuit block (block 720). Using an analog-to-digital converter (ADC), the method includes generating a plurality of bits, based on the analog signal, wherein the ADC is coupled to receive the local supply voltage (block 725).

In various embodiment the operating parameter includes an indication of a temperature of the functional circuit block. Operating the sensor circuit includes selecting a first subset of a plurality of bipolar transistors to be coupled to a first circuit branch of the sensor circuit, and a second subset of the plurality of bipolar transistors to be coupled to a second circuit branch of the sensor circuit. Subsequent to the selection and coupling, the method includes generating the analog signal based on a difference between base-emitter voltages of selected ones of the first subset of bipolar transistors and the second subset of bipolar transistor. For a subsequent cycle, the method includes selecting different ones of the plurality of bipolar transistors for the first and second subsets.

Figure 8:
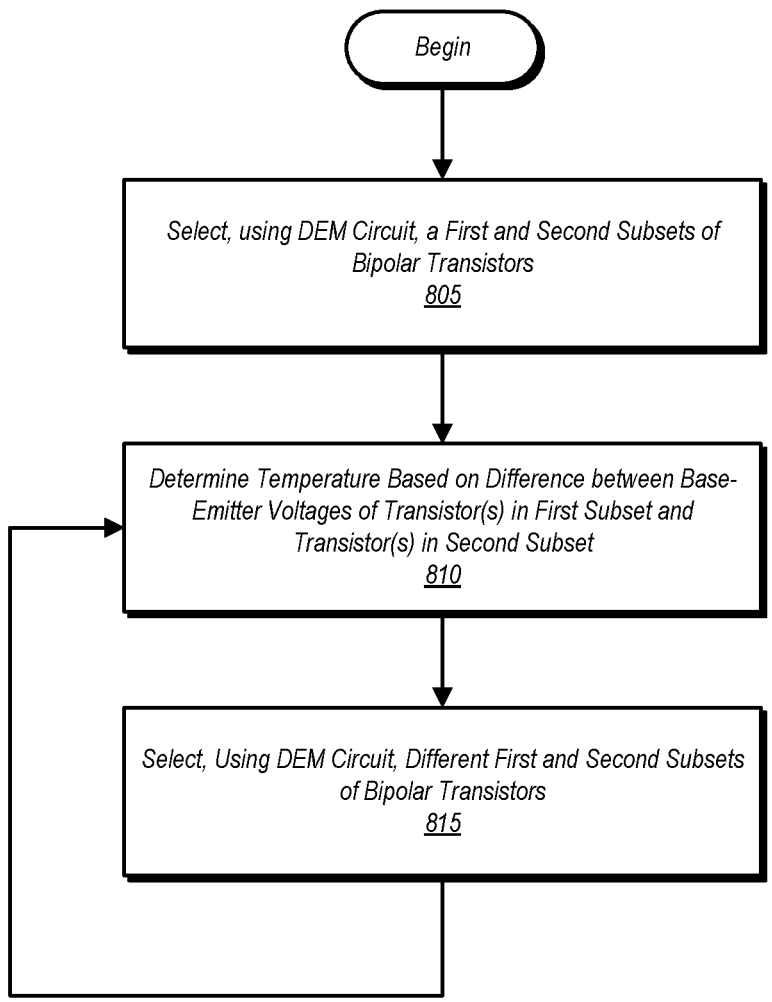
FIG. 8 is a flow diagram illustrating operation of one embodiment of a method for operating one embodiment of a temperature sensor.

FIG. 8 is a flow diagram illustrating operation of one embodiment of a method for operating one embodiment of a temperature sensor. Method 800 may be performed with various embodiments of sensing systems and sensor circuits as discussed above in FIGS. 1-7. Various circuit and system embodiments not explicitly discussed herein, but otherwise capable of carrying out Method 800 may also fall within the scope of this disclosure. The sensor circuit used in various embodiments of FIG. 8 is a $\Delta V_{BE}$ temperature sensor in which a temperature is determined on the basis of the difference of base-emitter voltages of different bipolar transistors.

Method 800 includes selecting, using a dynamic element matching (DEM) circuit, first and second subsets of bipolar transistors in a sensor circuit (block 805). The sensor circuit may include a plurality of bipolar transistors. The DEM circuit may connect the one or more bipolar transistors of the first subset to a first circuit branch of the sensor circuit and one or more bipolar transistor of the second subset to a second circuit branch of the sensor circuit. In some embodiments, this may involve, in a set of n bipolar transistors, connecting n−1 transistors to the first circuit branch and one transistor to the second circuit branch. However, the number of transistors connected to each circuit branch may vary from one embodiment to another.

The method further includes determining a temperature based on a difference between the base-emitter voltages of the bipolar transistors of the first and second subsets (block 810). The difference in the base-emitter voltages of transistors in the first and second subsets may be used to generate one or more analog signals that can be provided to an ADC turn the analog signal(s) into digital temperature information. After allowing a enough time to generate and stabilize the analog signal(s), the method further includes selecting, using the DEM circuit, different first and second subsets of bipolar transistors (block 815). More particularly, the selection of transistors used for the first and second subsets is changed from one cycle to the next.

Changing the selection of transistors used to generate the $\Delta V_{BE}$ on a cycle-by-cycle basis may have certain advantages. In practice, typical $\Delta V_{BE}$ temperature sensors are implemented using large numbers of bipolar transistors. This is due to inherent mismatches in the bipolar transistors used. Accordingly, the large number of bipolar transistors used may allow some averaging of these errors. However, this comes at the cost of a significant amount of circuit area on an IC. In the present disclosure, the use of dynamic element matching, through the use of a DEM circuit, allows for the use of a significantly lower number of transistors in implementing a $\Delta V_{BE}$ temperature sensor. Instead of trying to average out the mismatch-induced errors through a large number of transistors, the $\Delta V_{BE}$ temperature sensor of the present disclosure changes the selection of transistors used on a cycle-by-cycle basis, which may randomize the errors, and thus average them out over time. As such, a $\Delta V_{BE}$ temperature sensor of the present disclosure can be implemented in a significantly smaller area while achieving the desired accuracy of temperature measurement.

Figure 9:
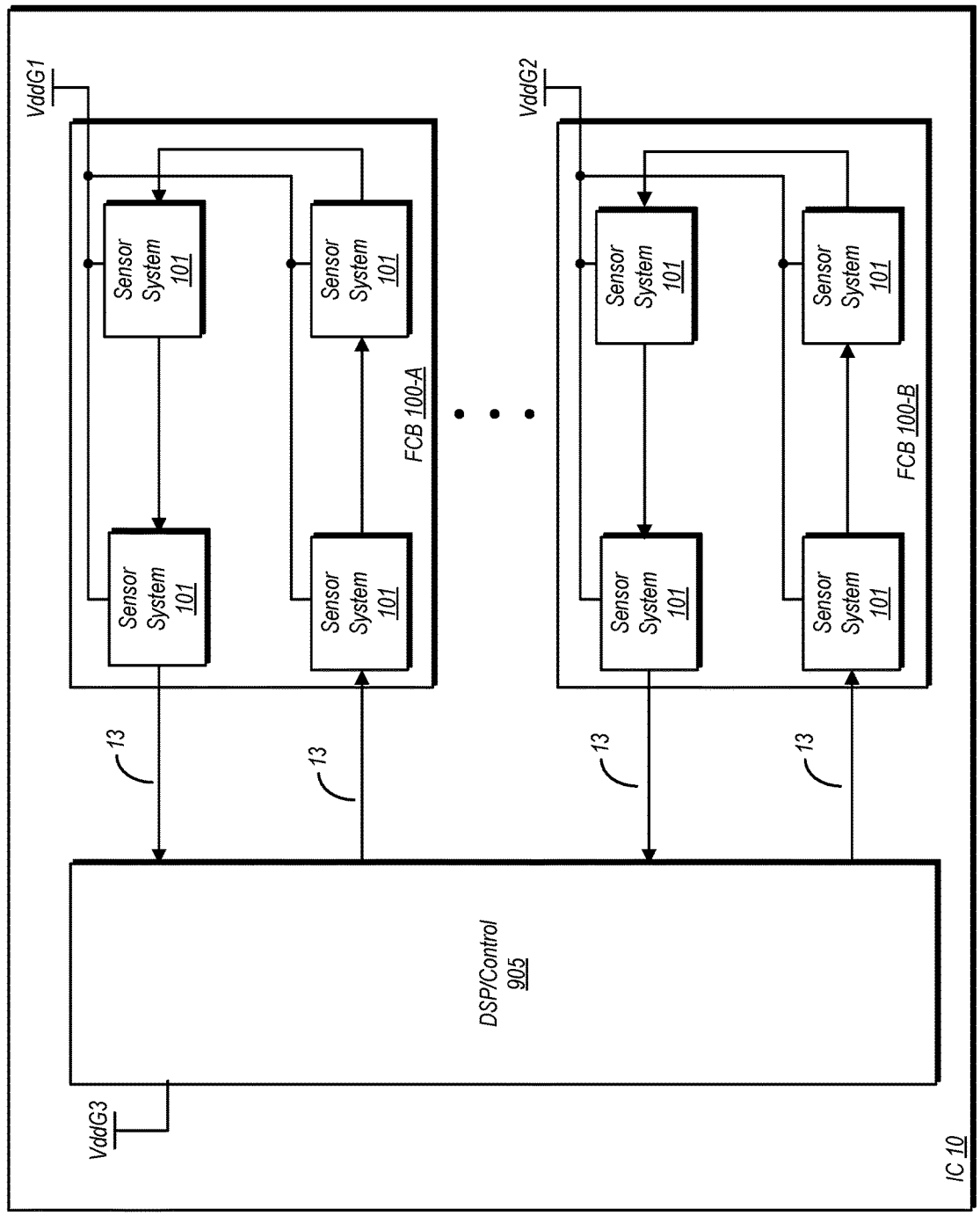
FIG. 9 is a block diagram of one embodiment of an integrated circuit having a distributed sensor system.

FIG. 9 is a block diagram of one embodiment of an integrated circuit. The embodiment shown in FIG. 9 is provided for the sake of example, but is not intended to limit the disclosure to what is shown in the drawing.

In the embodiment shown, IC 10 includes functional circuit block 100-A and 100-B. These functional circuit blocks may implement virtually any type of functional circuitry that can be implemented on an integrated circuit, including digital, analog, and/or mixed signal circuitry. Examples of functional circuit blocks that can be implemented in accordance with the embodiment shown include, but are not limited to, processor cores, interface units, radio transmitters and/or receivers, graphics processors, and so on. Functional circuit block 100-A in the embodiment shown is coupled to receive power via a power supply node VddG1, while functional circuit block 100-B is coupled to receive power via power supply node VddG2.

As shown in FIG. 9, functional circuit blocks 100-A and 100-B each include a number of sensor systems 101 embedded therein. It is noted that the spacing of these instances of sensor system 101 is shown by way of example, but is not intended to be indicative of their respective locations in practice. Instead, the sensor systems 101 of FIG. 9 may be placed within or near areas of a functional circuit block that are considered to be "hot spots", e.g., areas where a larger than average amount of heat may be generated due to the operation of the circuits therein. For example, an arithmetic unit that performs persistently performs a large number of complex calculations may generate more heat than a memory interface for which the relatively long latency of memory accesses results in a corresponding amount of time waiting for data to be returned from memory. Accordingly, the various instances of sensor system 101 shown here may be placed in areas of their respective functional circuit blocks where thermal issues are more likely to arise.

As noted above in various embodiments, each of the sensor systems 101 may include an ADC configured to digitize analog signals generated during temperature readings. The digital temperature readings from the various instances of sensor system 101 may be conveyed to a digital signal processing (DSP)/control circuit 905 in the embodiment shown, which operates on a supply voltage received via VddG3. As shown here, bus 13 couples the various instances of sensor system 101 in a daisy chain manner to one another and to DSP/control circuit 905. In various embodiments, DSP/control circuit 905 may convey commands to the various ones of sensor system 101 and may receive temperature measurement information therefrom, both by way of bus 13. DSP/control system 905 may perform further processing of the temperature information, and may also communicate with other entities such as a power management unit (not shown here) that may perform various actions based on temperature information received (e.g., reducing the workload of a processor core in which high temperatures were sensed).

In various embodiments, the instances sensor system 101 may be arranged in a manner similar to those discussed previously herein. For example, instances of the sensor system 101 may include a power converter (e.g., a boost converter) configured to generate a local supply voltage based on the received global supply voltage (e.g., VddG1), and a temperature sensor in accordance with the above that operates based on the local supply voltage that is generated by the correspondingly coupled power converter.

Figure 10:
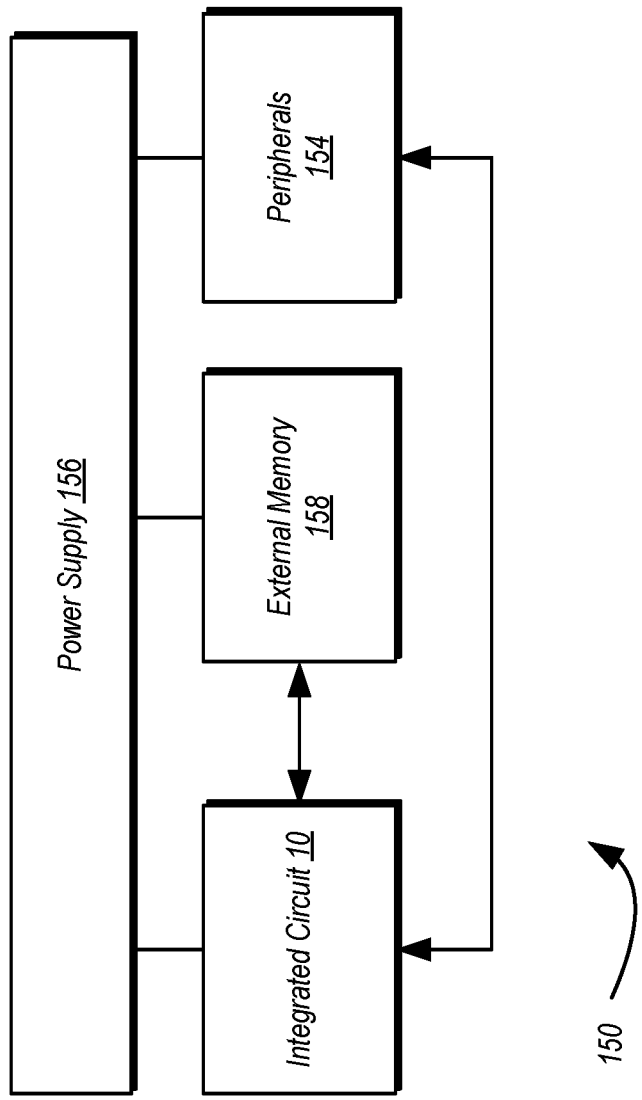
FIG. 10 is a block diagram of one embodiment of an example system.

FIG. 10 is a block diagram of one embodiment of an example system. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

System 150 in the embodiment shown may include one or more instances of a sensing system 101 as discussed in FIGS. 1-9 above, including the various subsystem/circuits thereof. For example, IC 10 of FIG. 10 may be configured similarly to that of FIG. 9 in various embodiments, including a number of sensing systems 101 implemented in various functional circuit blocks, with the sensing systems coupled in a daisy-chain configuration, by a bus, to a DSP/control circuit. The sensing systems may include circuits such as an embodiment of the temperature sensor of FIG. 2, a power converter of FIG. 4, and an ADC of FIG. 5 or 6.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, circuit, a system having a processor unit and a memory storing program instructions executable to implement e task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus, comprising:
    a functional circuit block coupled to a global power supply node;
    a power converter circuit configured to generate a regulated voltage level on a local power supply node using the regulated voltage level of the global power supply node, wherein the regulated voltage level is greater than a voltage level of an input power supply node, wherein the power converter circuit includes:
        a passgate having a first terminal coupled to receive the voltage level of the global power supply node;
        a ring oscillator configured to generate a periodic signal; and
        a feedback circuit coupled between the local power supply node and the passgate and configured to sample the regulated voltage level in accordance with the periodic signal and further configured to control the passgate based on samples of the regulated voltage level;
    a sensor circuit coupled to the local power supply node, wherein the sensor circuit includes switching circuitry, a first plurality of devices and a second plurality of devices, wherein the switching circuitry is configured to, at different ones of a plurality of time points, randomly select ones of the first plurality of devices to form first and second subsets, and further configured to at the different ones of the plurality of time points, couple ones of the first and second subsets to first and second circuit branches, respectively, the first and second circuit branches including ones of the second plurality of devices, and wherein the sensor circuit is further configured to:
  compare corresponding parameters of different ones of the first and second subsets of the first plurality of devices selected by the switching circuitry at a particular one of the plurality of time points to generate a plurality of comparison results; and
  generate an analog signal using the plurality of comparison results, wherein the analog signal is proportional to an operating parameter associated with the functional circuit block; and
an analog-to-digital converter (ADC) circuit coupled to the local power supply node, wherein the analog-to-digital converter circuit is configured to generate a plurality of bits using the analog signal.

2. The apparatus of claim 1, wherein the operating parameter includes a temperature of the functional circuit block.

3. The apparatus of claim 1, wherein the first plurality of devices comprises a plurality of bipolar transistors,
  wherein the switching circuitry includes a dynamic element matching switching circuit configured to select, using dynamic element matching, a first subset of the plurality of bipolar transistors to be coupled to the first circuit branch and a second subset of the plurality of bipolar transistors to be coupled to the second circuit branch for a given sample, wherein different ones of the plurality of bipolar transistors are selected to form the first and second subsets during different samples;
  wherein the sensor is configured to generate an indication of a temperature based on a difference between base-emitter voltages generated by bipolar transistors of the first subset and the second subset; and wherein the switching circuit is configured to select different ones of the plurality of bipolar transistors to be used to generate the indication of the temperature in a sample subsequent to a present sample.

4. The apparatus of claim 1, wherein the sensor includes a proportional-to-absolute-temperature (PTAT) control loop comprising the first circuit branch, and a complementary-to-absolute-temperature (CTAT) control loop separate from the PTAT control loop, the CTAT control loop comprising the second circuit branch.

5. The apparatus of claim 4, wherein the sensor includes:
  a first error amplifier implemented in the PTAT control loop;
  a first chopping circuit coupled to first and second inputs of the first error amplifier, wherein the first chopping circuit includes first and second inputs coupled to first and second circuit branches, respectively, of the PTAT control loop;
  a second error amplifier implemented in the CTAT control loop; and
  a second chopping circuit coupled to first and second inputs of the second error amplifier, wherein the second chopping circuit includes a first input coupled to the second circuit branch of the PTAT control loop, and a second input coupled to a third circuit branch implemented in the CTAT control loop.

6. The apparatus of claim 4, wherein the PTAT control loop includes:
  first and second current mirrors;
  a plurality of bias transistors, the plurality of bias transistors forming the second subset of the plurality of devices; and
  a crossbar circuit configured to selectively couple transistors of the first and second current mirrors to ones of plurality of bias transistors using dynamic element matching.

7. The apparatus of claim 1, wherein the power converter circuit includes:
  charge pump circuitry coupled to a second terminal of the passgate and configured to generate the regulated voltage level.

8. The apparatus of claim 1, wherein the ADC is a single-slope ADC configured to compare a voltage of the analog signal with a reference voltage to generate the plurality of bits.

9. The apparatus of claim 1, wherein the ADC is a sigma-delta ADC configured to generate the plurality of bits based on a voltage of the analog signal and a second voltage generated by the sensor circuit.

10. A method comprising:
  providing a global supply voltage to circuitry implemented in a functional circuit block;
  generating, using a power converter implemented in the functional circuit block, a local supply voltage based on the global supply voltage, wherein a voltage level of the local supply voltage is greater than the global supply voltage, wherein the generating the local supply voltage includes:
    receiving, on a first terminal of a passgate, the global supply voltage;
    generating, using a ring oscillator, a periodic signal;
    sampling, using a feedback circuit coupled to the passgate, the local supply voltage in accordance with the periodic signal;
    controlling the passgate based on samples of the local supply voltage;
  selecting, using switching circuitry, different ones of a first plurality of devices and a second plurality of devices at ones of a plurality of time points, wherein the selecting includes randomly selecting ones of the first plurality of devices to form first and second subsets, and wherein the selecting further includes coupling ones of the first and second subsets to first and second circuit branches, respectively, the first and second circuit branches including ones of the second plurality of devices;
  comparing corresponding parameters of different ones of the first and second subsets of the first plurality of devices implemented in a sensor circuit, wherein the comparing is performed at ones of the plurality of time points to generate a plurality of comparison results, wherein the sensor circuit is coupled to receive the local supply voltage;
  generating an analog signal using the plurality of comparison results, wherein the analog signal is proportional to an operating parameter associated with the functional circuit block; and
  generating a plurality of bits, using an analog-to-digital converter (ADC), based on the analog signal, wherein the ADC is coupled to receive the local supply voltage.

11. The method of claim 10, wherein the operating parameter includes an indication of a temperature of the functional circuit block.

12. The method of claim 10, wherein the first plurality of devices includes a plurality of bipolar transistors, and wherein the method further comprises:
  selecting, in the sensor circuit, a one of the plurality of bipolar transistors to be coupled to a first circuit branch of the sensor circuit, and different ones of the plurality of bipolar transistors to be coupled to a second circuit branch of the sensor circuit;
  generating the analog signal based on a difference between base-emitter voltages of selected ones of the plurality of bipolar transistors coupled to the first circuit branch and ones of the plurality of bipolar transistors coupled to the second circuit branch; and
  for a subsequent cycle, changing ones of the plurality of bipolar transistors that are coupled to the first and second circuit branches.

13. The method of claim 10, further comprising generating the local supply voltage using at least one charge pump coupled to receive the global supply voltage.

14. The method of claim 10, further comprising generating the plurality of bits using a sigma-delta ADC.

15. A system comprising:
  an integrated circuit having at least one functional circuit block;
  a sensor system implemented in the at least one functional circuit block, wherein the sensor system includes:
    a DC-DC converter configured to generate a local supply voltage on a local supply voltage node based on a global supply voltage provided to circuitry of the at least one functional circuit block, wherein a value of the local supply voltage is greater than a value of the global supply voltage, wherein the DC-DC converter includes:
      a passgate having a first terminal coupled to receive the global supply voltage;
      a ring oscillator configured to generate a periodic signal; and
      a feedback circuit coupled between the local supply voltage node and the passgate, wherein the feedback circuit is configured to sample the local supply voltage in accordance with the periodic signal, and further configured to generate an error signal to control the passgate based on samples of the local supply voltage;
    a temperature sensor including switching circuitry, a first plurality of devices, and a second plurality of devices, wherein the temperature sensor is configured to, for ones of a plurality of time points, generate a corresponding analog signal indicative of a temperature of the at least one functional circuit block by comparing corresponding parameters of different ones of first and second subsets of the first plurality of devices randomly selected by the switching circuitry at different ones of the plurality of time points to generate a plurality of comparison results, wherein the temperature sensor is coupled to receive the local supply voltage, wherein, in selecting ones of the first and second subsets, the switching circuitry is configured to couple selected devices of the first and second subsets to first and second circuit branches, respectively, the first and second circuit branches including ones of the second plurality of devices; and
    an analog-to-digital converter (ADC) coupled to receive the local supply voltage and configured to generate a plurality of bits based on the analog signal.

16. The system as recited in claim 15, wherein the temperature sensor includes a proportional-to-absolute-temperature (PTAT) control loop comprising the first circuit branch, and a complementary-to-absolute-temperature (CTAT) control loop separate from the PTAT control loop, the CTAT control loop comprising the second circuit branch.

17. The system as recited in claim 16, wherein the temperature sensor further includes:
  a first error amplifier implemented in the PTAT control loop;
  a first chopping circuit coupled to first and second inputs of the first error amplifier, wherein the first chopping circuit includes a first and second inputs coupled to first and second circuit branches, respectively, of the PTAT control loop;
  a second error amplifier implemented in the CTAT control loop;
  a second chopping circuit coupled to first and second inputs of the second error amplifier, wherein the second chopping circuit includes a first input coupled the second circuit branch of the PTAT control loop, and a second input coupled to a third circuit branch implemented in the CTAT control loop.

18. The system of claim 15, wherein:
  the first plurality of devices comprises a plurality of bipolar transistors, wherein the switching circuitry includes a dynamic element matching switching circuit configured to select, for a given sample, particular ones of the plurality of bipolar transistors as the first and second subsets to be coupled to the first and second circuit branches of the temperature sensor, respectively;
  the sensor is configured to generate the analog signal based on a difference between base-emitter voltages generated by bipolar transistors of the first subset and the second subset; and
  the switching circuit is configured to select different ones of the plurality of bipolar transistors as the first and second subsets of bipolar transistors for a sample subsequent to the given sample.

19. The system of claim 15, wherein the DC-DC converter includes:
  charge pump circuitry coupled to a second terminal of the passgate and configured to generate the local supply voltage on a local supply voltage node.

20. The system of claim 15, wherein the ADC is a sigma-delta ADC configured to generate the plurality of bits based on a voltage of the analog signal and a second voltage generated by the sensor system.

* * * * *